United States Patent
Nakashima et al.

(10) Patent No.: US 9,743,545 B2
(45) Date of Patent: Aug. 22, 2017

(54) ELECTRICAL CONNECTION BOX AND WIRE HARNESS

(71) Applicant: YAZAKI CORPORATION, Tokyo (JP)

(72) Inventors: Akinori Nakashima, Shizuoka (JP); Nobutaka Kaneko, Shizuoka (JP); Yoshiya Miyazaki, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/137,438

(22) Filed: Apr. 25, 2016

(65) Prior Publication Data

US 2016/0315459 A1    Oct. 27, 2016

(30) Foreign Application Priority Data

Apr. 27, 2015    (JP) .................. 2015-090554

(51) Int. Cl.
*H01R 13/60*    (2006.01)
*H01R 13/66*    (2006.01)
(Continued)

(52) U.S. Cl.
CPC ......... *H05K 5/0247* (2013.01); *H02G 3/0691* (2013.01); *H02G 3/083* (2013.01); *B60R 16/0238* (2013.01); *H02G 3/088* (2013.01)

(58) Field of Classification Search
CPC ........ H02G 3/0616; H02G 3/08; H02G 3/081; H02G 3/083; H02G 3/085; H02G 3/086;
(Continued)

(56) References Cited

U.S. PATENT DOCUMENTS

| 5,897,392 A * | 4/1999 | Takahashi .......... H01R 13/5804 439/467 |
| 6,541,700 B2 * | 4/2003 | Chiriku .................. H02G 3/081 174/50 |

(Continued)

FOREIGN PATENT DOCUMENTS

| JP | 9-163550 A | 6/1997 |
| JP | 2012-239336 A | 12/2012 |

OTHER PUBLICATIONS

Japanese Office Action for the related Japanese Patent Application No. 2015-090554 dated May 16, 2017.

*Primary Examiner* — Chau N Nguyen
*Assistant Examiner* — Roshn Varghese
(74) *Attorney, Agent, or Firm* — Kenealy Vaidya LLP

(57) ABSTRACT

An electrical connection box applied to a wire harness includes a casing and a cover member. The casing is provided with a first member that houses an electronic component and a second member and an insertion port formed on the first member, and an exterior installation unit formed outside the insertion port of the first member with an end of an exterior member of which being arranged in a stacking direction. The cover member has a pair of locking units, and is locked to the exterior installation unit via the pair of locking units and holds an end of the exterior member between the cover member and the first member. The second member includes a pressing wall that interposes an end to be pressed of the cover member between the pressing wall and the first member and that presses the end to be pressed toward the first member side.

11 Claims, 7 Drawing Sheets

(51) Int. Cl.
*H05K 5/02* (2006.01)
*H02G 3/06* (2006.01)
*H02G 3/08* (2006.01)
*B60R 16/023* (2006.01)

(58) Field of Classification Search
CPC .......... H02G 3/088; H02G 3/14; H02G 15/06; H01R 13/506; H01R 13/508; H01R 13/567; H01R 13/5816; H01R 13/582; H01R 13/5833; B60R 16/0215; H05K 5/0247; H05K 5/061; H05K 7/20418
USPC .................................................. 439/76.2, 532
See application file for complete search history.

(56) References Cited

U.S. PATENT DOCUMENTS

| | | | | |
|---|---|---|---|---|
| 7,172,440 B2* | 2/2007 | Kanamaru | ............... | H01R 9/24 439/135 |
| 7,507,905 B2* | 3/2009 | Kanamaru | ............... | H01R 9/24 174/489 |
| 7,893,364 B2* | 2/2011 | Oda | ............. | H05K 7/026 174/50 |
| 8,907,215 B2 | 12/2014 | Sakai et al. | | |
| 2008/0293269 A1* | 11/2008 | Kurizono | ............. | H01R 13/567 439/76.2 |
| 2012/0285728 A1* | 11/2012 | Sakai | .................. | H02G 3/0691 174/152 G |

* cited by examiner

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2015-090554 filed in Japan on Apr. 27, 2015.

BACKGROUND OF THE INVENTION

1. Field of the Invention

The present invention relates to an electrical connection box and a wire harness.

2. Description of the Related Art

As a conventional electrical connection box applied to a wire harness installed in a vehicle and the like, for example, Japanese Patent Application Laid-open No. 9-163550 discloses an electrical connection box that includes an opening for extracting electric wires on the outside wall, and in which the electric wires extracted from the opening are bent outside the opening and extended along the outside wall. In this electrical connection box, a protection cover used for closing the opening, is integrally and rotatably connected to the edge of the opening disposed at the side opposite from the extracting direction of the electric wires, in the same direction as the bending direction of the electric wires, with a hinge. The protection cover is formed in a gutter-like shape, so that the electric wires can be housed therein. The electrical connection box also includes a locking means that locks the protection cover with the outside wall, on the protection cover and the outside wall, while the electric wires are interposed between the protection cover and the outside wall.

The electrical connection box disclosed in Japanese Patent Application Laid-open No. 9-163550 described above, for example, may be applied to an object in which an exterior member such as a corrugated tube is externally fitted to the electric wires. In such a case, it has been desired that the end of the exterior member be firmly fitted to the electric wires.

SUMMARY OF THE INVENTION

The present invention has been made in view of the above circumstances, and an object of the present invention is to provide an electrical connection box and a wire harness capable of firmly fitting the end of the exterior member externally fitted to the electric wires.

In order to achieve the above mentioned object, an electrical connection box according to one aspect of the present invention includes a casing that includes a first member that houses inside an electronic component, and a second member, the first member and the second member being stacked in a stacking direction and fitted to each other, an insertion port formed on the first member and through which an electric wire connected to the electronic component is inserted, and an exterior installation unit formed outside the insertion port of the first member, and on which an end of an exterior member externally fitted to the electric wire is arranged in the stacking direction; and a cover member that includes a pair of locking units that face each other in a direction intersecting the stacking direction, the cover member being locked to the exterior installation unit via the pair of locking units, and interposing and holding the end of the exterior member between the cover member and the first member, wherein the second member includes a pressing wall that interposes an end to be pressed between the pressing wall and the first member and presses the end to be pressed toward the first member side, the end to be pressed being an end of one side of the cover member in the stacking direction as well as an end opposite from a side toward which the exterior member is extended.

Further, in the electrical connection box according to another aspect of the present invention, it is possible to configure that the end to be pressed and the pressing wall have an overlapped portion that is overlapped in a direction toward which the end to be pressed is pressed by the pressing wall.

In order to achieve the above mentioned object, a wire harness according to still another aspect of the present invention includes an electric wire; an exterior member externally fitted to the electric wire; and an electrical connection box that includes a casing including a first member that houses inside an electronic component connected to the electric wire, and a second member, the first member and the second member being stacked in a stacking direction and fitted to each other, an insertion port formed on the first member and through which the electric wire is inserted, and an exterior installation unit formed outside the insertion port of the first member, and on which an end of the exterior member externally fitted to the electric wire is arranged in the stacking direction, and a cover member that has a pair of locking units that face each other in a direction intersecting the stacking direction, the cover member being locked to the exterior installation unit via the pair of locking units, and interposing and holding the end of the exterior member between the cover member and the first member, wherein the second member includes a pressing wall that interposes an end to be pressed between the pressing wall and the first member and presses the end to be pressed toward the first member side, the end to be pressed being an end of one side of the cover member in the stacking direction as well as an end opposite from a side toward which the exterior member is extended.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment according to the present invention will now be described in detail with reference to the accompanying drawings. It is to be noted that the present invention is not limited to the embodiment. Further, the constituents of the embodiment below include constituents that can be easily replaced by those skilled in the art and constituents substantially same as the constituents of the embodiment.

Embodiment

Figure 1:
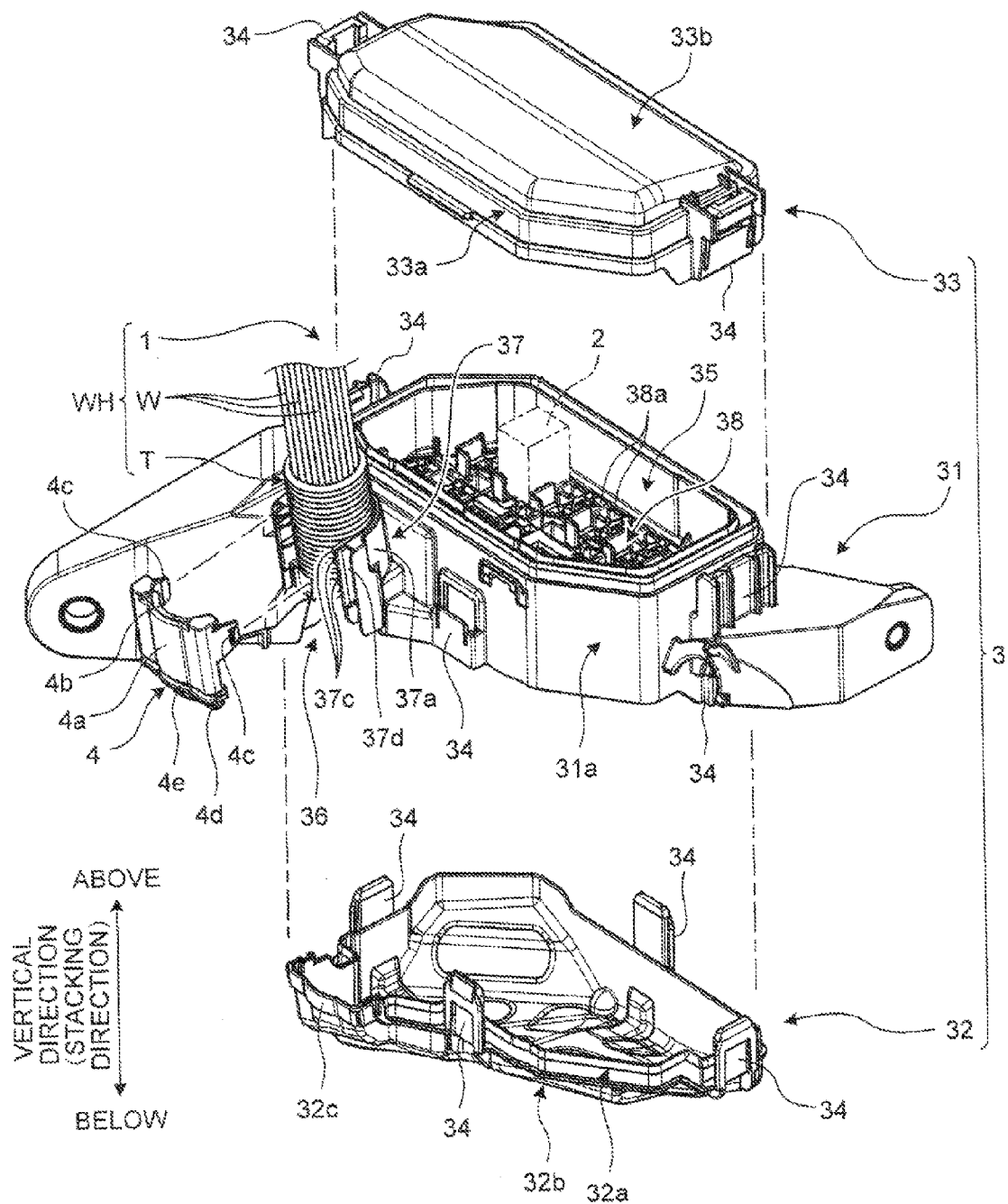
FIG. 1 is an exploded perspective view illustrating a schematic configuration of an electrical connection box according to an embodiment.
Figure 2:
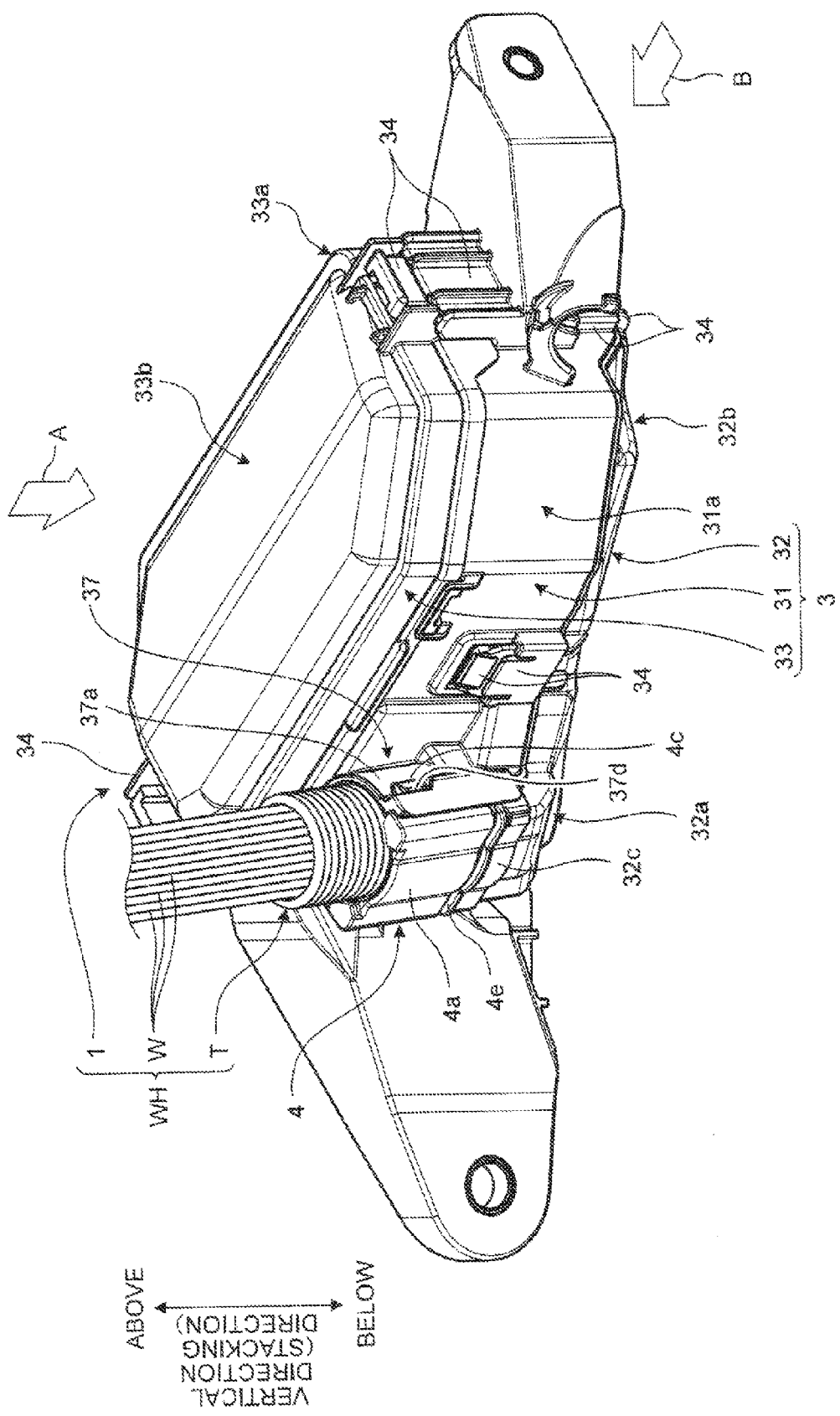
FIG. 2 is a perspective view illustrating a schematic configuration of the electrical connection box according to the embodiment.
Figure 3:
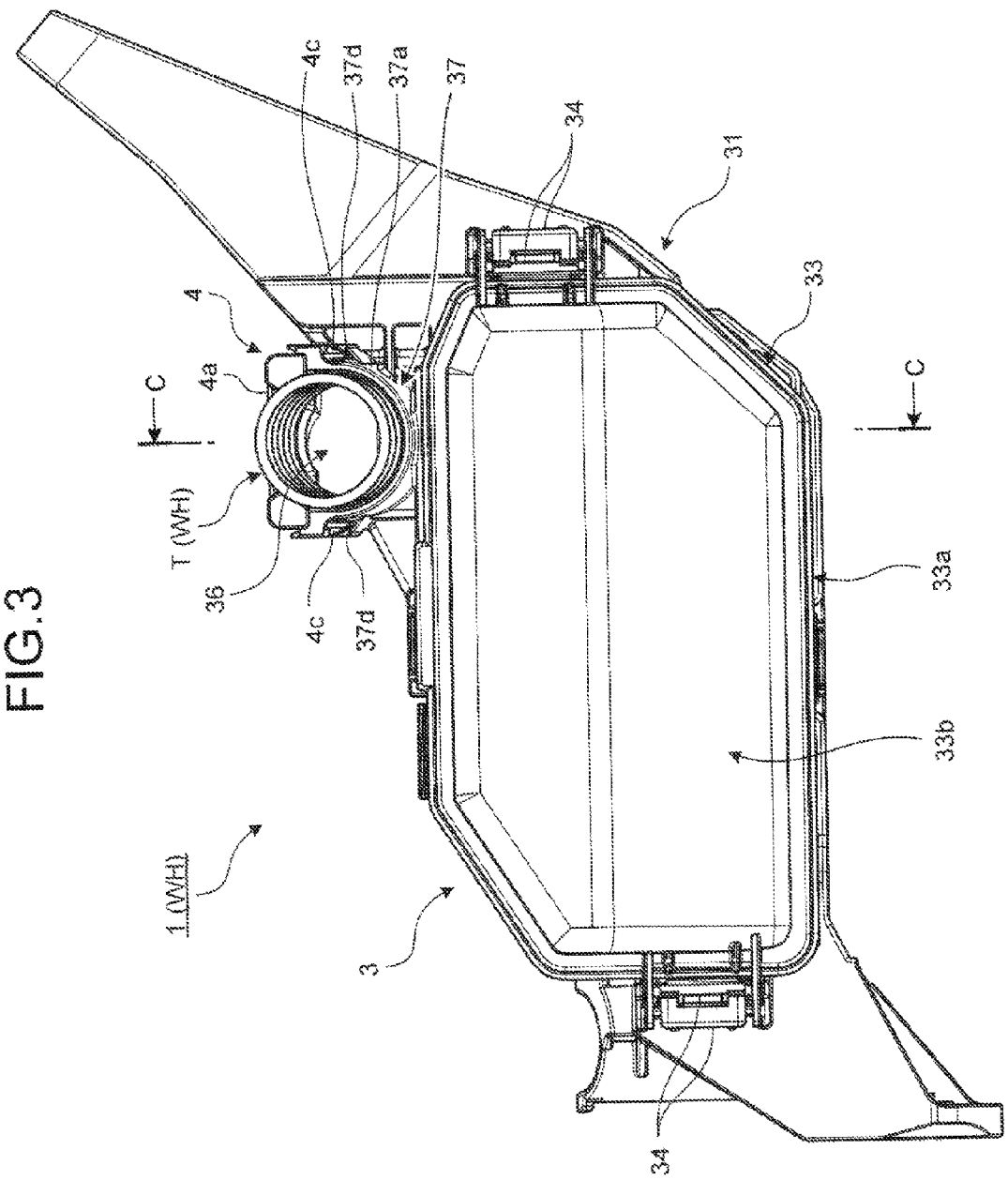
FIG. 3 is a fragmentary view taken in the direction of the arrow A in FIG. 2.
Figure 4:
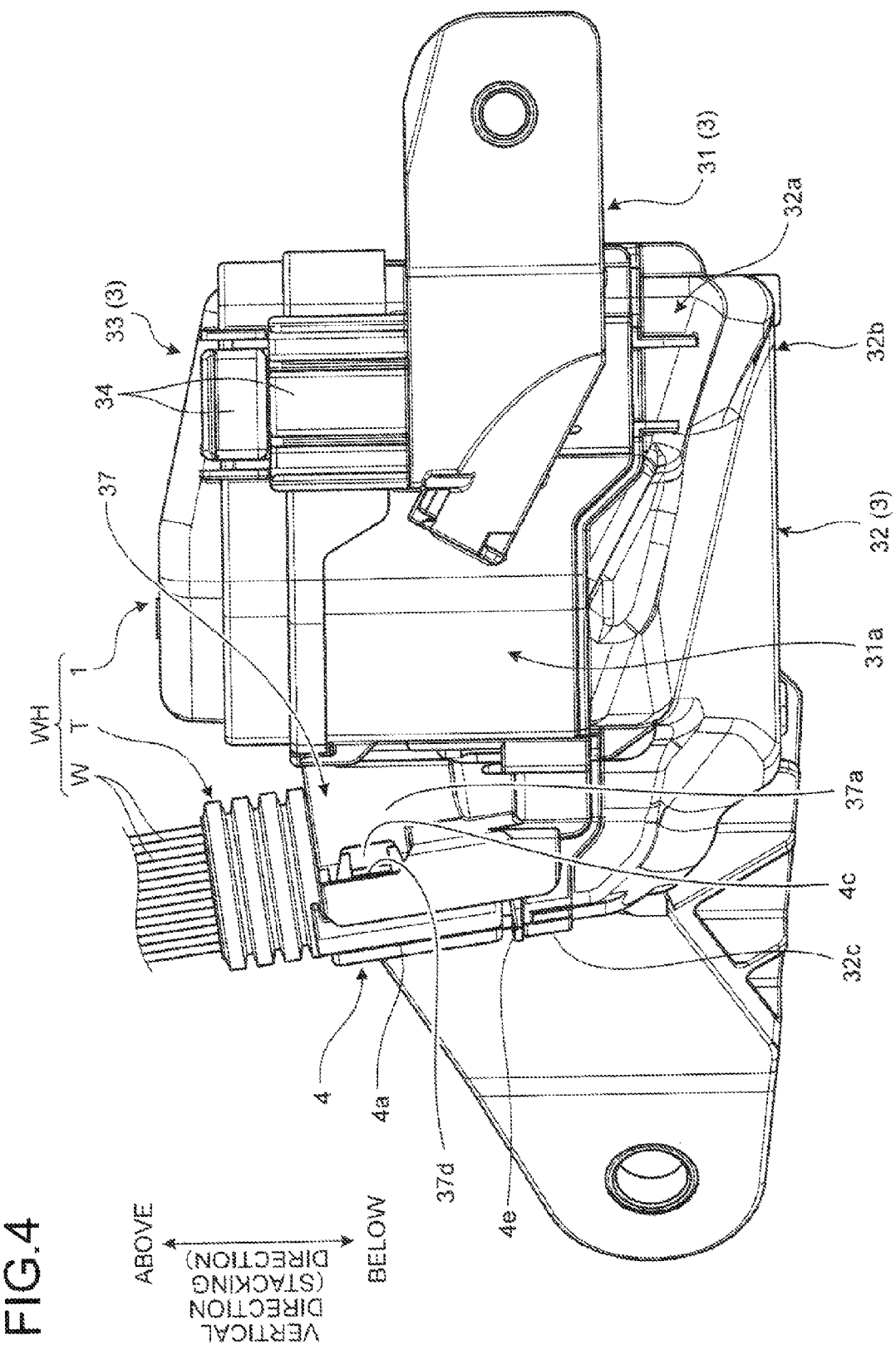
FIG. 4 is a fragmentary view taken in the direction of the arrow B in FIG. 2.
Figure 5:
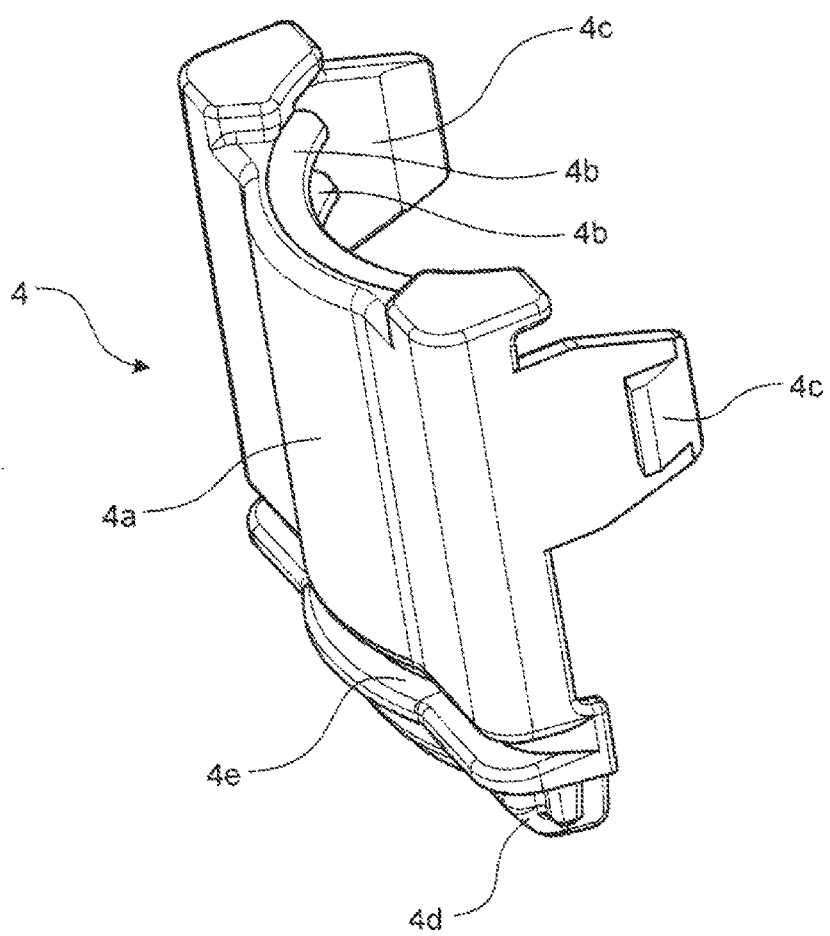
FIG. 5 is a perspective view illustrating a schematic configuration of a corrugated cover of the electrical connection box according to the embodiment.
Figure 6:
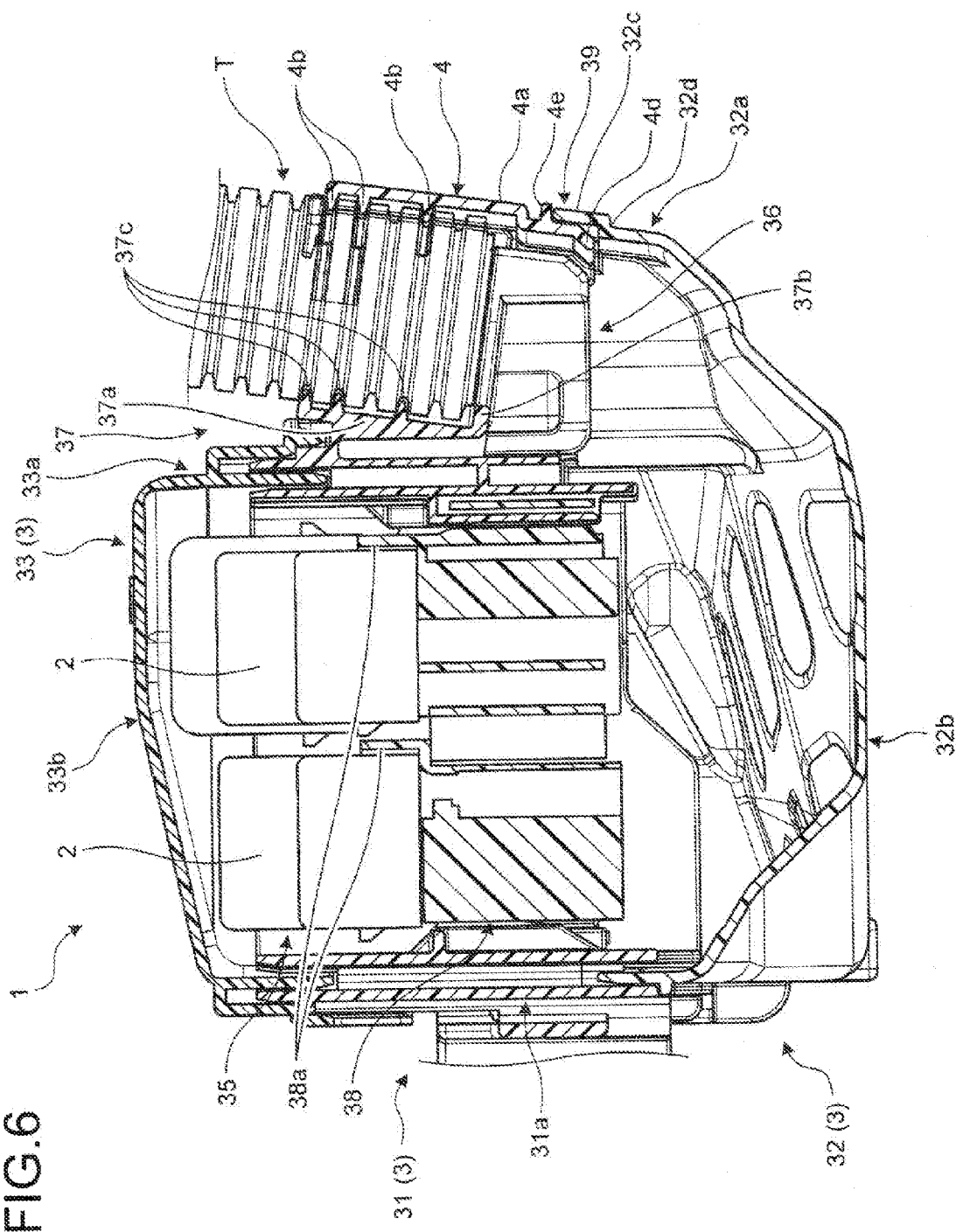
FIG. 6 is a sectional view cut along the line C-C in FIG. 3.
Figure 7:
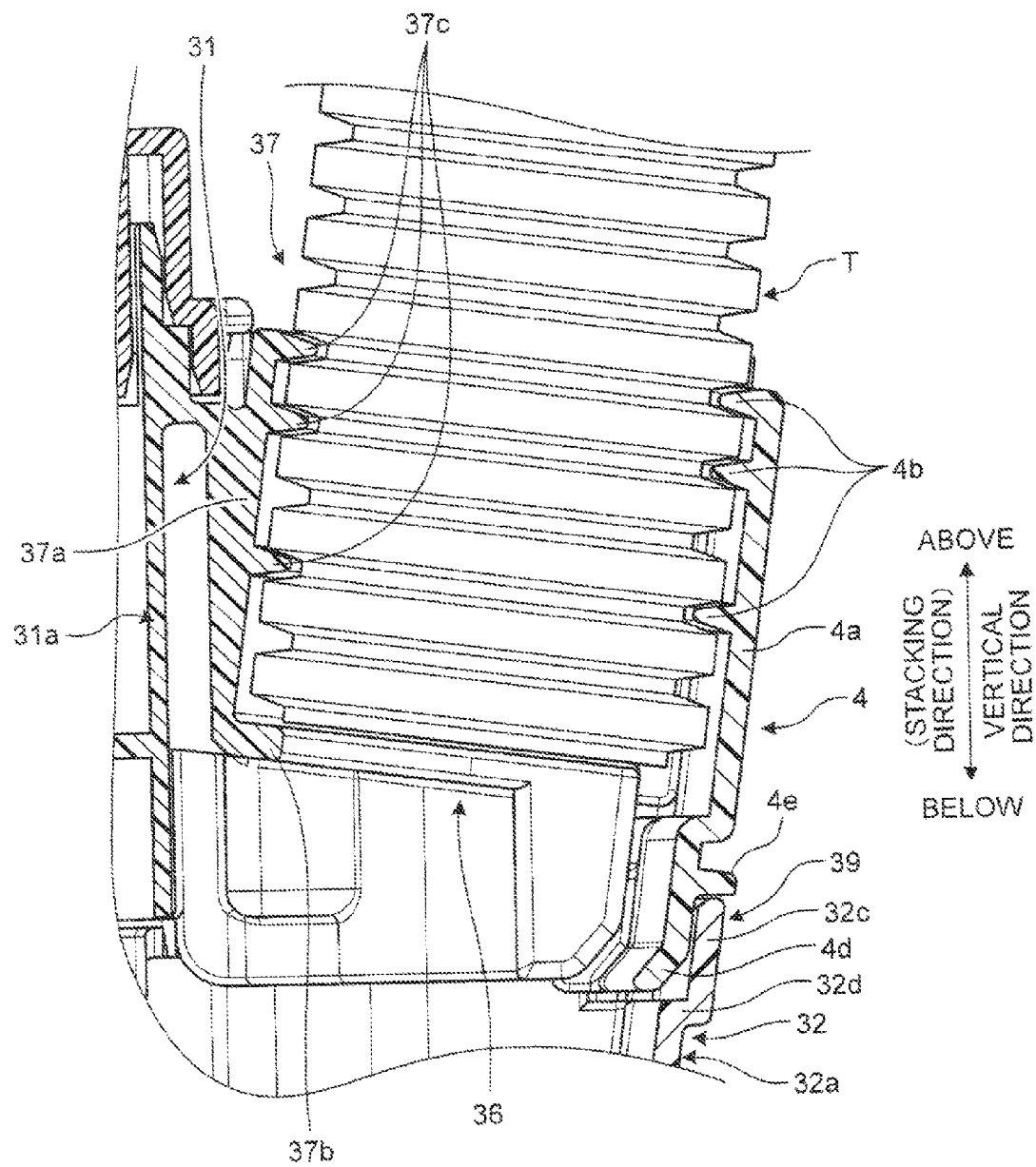
FIG. 7 is a partial sectional view including the corrugated cover of the electrical connection box according to the embodiment.

FIG. 1 is an exploded perspective view illustrating a schematic configuration of an electrical connection box according to an embodiment. FIG. 2 is a perspective view illustrating a schematic configuration of the electrical connection box according to the embodiment. FIG. 3 is a fragmentary view (top view) taken in the direction of the arrow A in FIG. 2. FIG. 4 is a fragmentary view (side view) taken in the direction of the arrow B in FIG. 2. FIG. 5 is a perspective view illustrating a schematic configuration of a corrugated cover of the electrical connection box according to the embodiment. FIG. 6 is a sectional view cut along the line C-C in FIG. 3. FIG. 7 is a partial sectional view including the corrugated cover of the electrical connection box according to the embodiment. In FIG. 1, to make it easier to understand, a part of electronic components housed in the electrical connection box is indicated in alternate long and two short dashes lines. Also, to make it easier to understand, a part or all of electric wires are not illustrated in FIG. 1, FIG. 3, FIG. 6, and FIG. 7.

An electrical connection box 1 illustrated in FIG. 1, FIG. 2, FIG. 3, and FIG. 4 is installed in a vehicle such as an automobile, and built into a wire harness WH. The electrical connection box 1 integrates and houses therein electric components such as a connector, a fuse, a relay, a branch unit, and an electronic control unit that configure connection processing components such as an electric wire. For example, the electrical connection box 1 is provided in an engine room of a vehicle or a lower portion of a vehicle body, and is connected to and interposed between a power source such as a battery and various electronic devices installed in the vehicle. The electrical connection box 1 distributes electric power supplied from the power source to various electronic devices in the vehicle. The electrical connection box 1 is also referred to as a junction box, a fuse box, a relay box, and the like, but in the present embodiment, these are collectively called an electrical connection box. In the following, unless otherwise specified, the direction is given under the assumption that the electrical connection box 1 is being installed in the vehicle.

For example, the wire harness WH is used to establish a connection between the devices installed in a vehicle. The wire harness WH is an assembly in which a plurality of electric wires W, which are used to supply electric power or for signal communication, are bundled together, so that the electric wires W are connected to the devices all at once by a connector and the like. The wire harness WH includes the electric wires W, a corrugated tube T that is an exterior member externally fitted to the electric wires W, and the electrical connection box 1 that is electrically connected to the electric wires W. For example, the electric wires W includes a conductor (core wire) obtained by twisting a plurality of conductive metal strands, and an insulating coating that covers the outside of the conductor. The corrugated tube T is a flexible tube (pipe), and in this example, is formed in a cylindrical shape. Typically, the corrugated tube T is formed in a bellows shape, and a plurality of uneven portions are formed on the outer peripheral surface thereof in the circumferential direction. The electric wires W are inserted into the corrugated tube T. The wire harness WH is obtained by bundling the electric wires W together to be an assembly, and the corrugated tube T is fitted to the outside of the bundled electric wires W. Also, the electrical connection box 1 is electrically connected to the end of the bundled electric wires W via the connector or the like as a connection unit. The wire harness WH may also include a grommet, a protector, a fixing member, and the like.

The electrical connection box 1 includes electronic components 2 (see also FIG. 6), a casing 3 that houses the electronic components 2, and a corrugated cover 4 that is a cover member fitted to the casing 3. In the electrical connection box 1, various electronic components 2 are housed in a housing space 35 (see also FIG. 6) in the casing 3. In the electrical connection box 1 according to the present embodiment, the casing 3 has an insertion port 36 (see also FIG. 6 and FIG. 7). The electric wires W, which are electrically connected to the electronic components 2 housed in the casing 3, are inserted into and extracted from the casing 3 through the insertion port 36. The electric wires W are bent outside the insertion port 36 and extended along a wall (a side wall 31a, which will be described below) of the casing 3 with the corrugated tube T. For example, in the electrical connection box 1, because the corrugated cover 4 is fitted to the casing 3, an end of the corrugated tube T is held between the casing 3 and the corrugated cover 4. Thus, for example, in the electrical connection box 1, even if the number or the diameter of the electric wires W, which are routed in the electrical connection box 1, are changed, it is possible to prevent water from directly entering the casing 3 through the insertion port 36. This is possible because the end of the corrugated tube T is held at the insertion port 36. Hereinafter, each configuration of the electrical connection box 1 will be specifically described with reference to the accompanying drawings.

The electronic components 2 are housed inside the casing 3, and are electrically connected to the electric wires W. The electronic components 2 are provided in multiple numbers. For example, each of the electronic components 2 is a connector, a fuse, a relay, a branch unit, an electronic control unit, an electronic component unit, and the like. The electronic component unit is obtained by unitizing the connector, the fuse, the relay, the branch unit, and the electronic control unit.

The casing 3 includes the housing space 35 that is formed therein and that houses the electronic components 2. The casing 3 includes a frame 31 as a first member, a lower cover 32 as a second member, and an upper cover 33 as a third member. The casing 3 has a three-layer divided structure in which the frame 31, the lower cover 32, and the upper cover 33 are divided. In the casing 3, the frame 31, the lower cover 32, and the upper cover 33 are stacked in a predetermined stacking direction, fitted to each other and partition the housing space 35 that houses the electronic components 2 therein. The frame 31, the lower cover 32, and the upper cover 33 are made of insulating synthetic resin.

The frame 31 is a principle member that forms the housing space 35 in which the electronic components 2 are fitted. The frame 31 is formed in a hollow shape by the side wall 31a that is a wall having a polygonal tube shape (rectangular tube shape). While the electrical connection box 1 is connected to the engine room and the like, openings are disposed on the vertically upper side and vertically lower side of the frame 31. The lower cover 32 is a plate-like (tray-like) member that closes the opening on the vertically lower side of the frame 31. The lower cover 32 is formed in a hollow shape by a side wall 32a that is a wall having a polygonal tube shape (rectangular tube shape), and a base unit 32b that closes one opening (opening on the vertically lower side) of the side wall 32a. The upper cover 33 is a lid-like member that covers the opening on the vertically upper side of the frame 31. The upper cover 33 is formed in a hollow shape by a side wall 33a that is a wall having a polygonal tube shape (rectangular tube shape), and a ceiling unit 33b that closes the other opening (opening on the vertically upper side) of the side wall 33a. In the casing 3, the opening on the vertically lower side of the frame 31 and the opening of the lower cover 32 face each other. Also, the opening on the vertically upper side of the frame 31 and the opening of the upper cover 33 face each other. The lower cover 32 is fitted on the vertically lower side of the frame 31, and the upper cover 33 is fitted on the vertically upper side of the frame 31. In the casing 3, the frame 31 is locked to the upper cover 33 and the lower cover 32 via a locking mechanism 34 of various forms. Typically, while the electrical connection box 1 is connected to the engine room and the like, the stacking direction toward which the frame 31, the upper cover 33, and the lower cover 32 are stacked, is in the vertical direction. However, depending on the installation status of the electrical connection box 1, the stacking direction may be set with a predetermined angle relative to the vertical direction.

The casing 3 configured of the frame 31, the lower cover 32, and the upper cover 33 includes the housing space 35, the insertion port 36, and an exterior installation unit 37.

The housing space 35 (see also FIG. 6) is a space partitioned by and surrounded by the frame 31, the lower cover 32, and the upper cover 33. In other words, in the housing space 35, a direction intersecting the vertical direction is partitioned by the side wall 31a of the frame 31, the side wall 32a of the lower cover 32, and the side wall 33a of the upper cover 33. The lower side in the vertical direction of the housing space 35 is partitioned by the base unit 32b of the lower cover 32, and the upper side in the vertical direction of the housing space 35 is partitioned by the ceiling unit 33b of the upper cover 33. In the electrical connection box 1, a block 38 (see also FIG. 6) is provided in the housing space 35. The block 38 is removably fitted to the frame 31. Similarly to the frame 31 and the like, the block 38 is made of synthetic resin, and a plurality of cavities 38a are formed thereon. The electronic components 2 are fitted in the cavities 38a. The electronic components 2 are inserted and fitted to the cavities 38a from vertically above the block 38, and terminals that form terminals of the electric wires W are inserted and fitted from vertically below the block 38. Thus, the electronic components 2 are electrically connected to the electric wires W.

The insertion port 36 (see also FIG. 6 and FIG. 7) is used to insert and extract the electric wires W, which are connected to the electronic components 2 in the housing space 35, into and from the casing 3, in other words, into and from the housing space 35. In this example, the insertion port 36 is formed on the frame 31. In the frame 31, the insertion port 36 is formed on a wall in a direction intersecting the stacking direction, in other words, on one of the wall surfaces that configure the side wall 31a. The insertion port 36 is formed on an end on the vertically lower side of the frame 31, in other words, on an end of the side to which the lower cover 32 is provided. While the lower cover 32 is fitted to the frame 31, the insertion port 36 is opened vertically upward. The electric wires W connected to the electronic components 2 in the housing space 35 are inserted into and extracted from the casing 3 through the insertion port 36, to be routed.

The exterior installation unit 37 is formed outside the insertion port 36 of the frame 31, and on which the end of the corrugated tube T is arranged in the stacking direction. In the frame 31, the exterior installation unit 37 is provided on a wall in a direction intersecting the stacking direction, in other words, on a wall surface on which the insertion port 36 described above is formed, among the wall surfaces that configure the side wall 31a. In the frame 31, the exterior installation unit 37 is formed so as to expose to the outside, which is the side opposite from the inside in which the housing space 35 is formed. As illustrated in FIG. 6 and FIG. 7, the exterior installation unit 37 includes an installation wall surface 37a, a receiving unit 37b, a fitting protrusion 37c, and a locking unit 37d. The installation wall surface 37a is a semi-cylindrical portion formed along the exterior of the corrugated tube T, and is integrally formed with the side wall 31a on the wall surface outside the side wall 31a. The installation wall surface 37a has a positional relation in which the outer peripheral surface side faces the side wall 31a, and the center axis direction is slightly tilted relative to the vertical direction. The receiving unit 37b is formed at an end on the vertically lower side of the inner peripheral surface of the installation wall surface 37a having a semi-cylindrical shape. The receiving unit 37b is a semicircular arc protrusion that extends along the inner peripheral surface of the installation wall surface 37a. While the end of the corrugated tube T is installed on the exterior installation unit 37, the receiving unit 37b is formed as a surface with which an end surface of the corrugated tube T comes into contact, and that receives the end surface of the corrugated tube T. A plurality of the fitting protrusions 37c are provided on the vertically upper end portion and middle portion of the inner peripheral surface of the installation wall surface 37a having a semi-cylindrical shape. In this example, there are three fitting protrusions 37c. Each of the fitting protrusions 37c is formed as a semicircular arc protrusion that extends along the inner peripheral surface of the installation wall surface 37a. While the end of the corrugated tube T is installed on the exterior installation unit 37, each of the fitting protrusions 37c is formed as a portion to be fitted and meshed to the uneven portions in a bellows shape, formed on the outer peripheral surface of the corrugated tube T. The locking unit 37d is a portion used to lock the corrugated cover 4. A pair of the locking units 37d are provided on the outer peripheral surface side of the end of the installation wall surface 37a having a semi-cylindrical shape. In this example, each of the locking units 37d is a locking recess to which a locking claw of a locking unit 4c in the corrugated cover 4, which will be described below, is capable of locking.

The corrugated cover 4 is fitted to the casing 3, and the end of the corrugated tube T is held between the casing 3 and the corrugated cover 4. As illustrated in FIG. 5, FIG. 6, and FIG. 7, the corrugated cover 4 includes a cover wall surface 4a, a fitting protrusion 4b, and the locking unit 4c. The cover wall surface 4a is a semi-cylindrical portion formed along the exterior of the corrugated tube T, and similar to the frame 31 and the like, is made of insulating synthetic resin. A plurality of the fitting protrusions 4b are provided on the vertically upper end portion and middle portion of the inner peripheral surface of the cover wall surface 4a having a semi-cylindrical shape. In this example, there are three fitting protrusions 4b. Each of the fitting protrusions 4b is a semicircular arc protrusion that extends along the inner peripheral surface of the installation wall surface 37a. While the end of the corrugated tube T is installed on the exterior installation unit 37, and the corrugated cover 4 is fitted to the exterior installation unit 37, each of the fitting protrusions 4b is formed as a portion to be fitted and meshed to the uneven portions in a bellows shape, formed on the outer peripheral surface of the corrugated tube T. While the corrugated cover 4 is fitted to the exterior installation unit 37, the fitting protrusions 4b are formed on locations almost facing the fitting protrusions 37c of the exterior installation unit 37, interposing the corrugated tube T therebetween. The locking unit 4c is a portion used to lock the exterior installation unit 37. A pair of the locking units 4c are provided on the outer peripheral surface side of the end of the cover wall surface 4a having a semi-cylindrical shape. In other words, while the corrugated cover 4 is fitted to the exterior installation unit 37, the pair of locking units 4c are provided so as to face each other in the direction intersecting the stacking direction. In this example, the locking units 4c are formed on the cover wall surface 4a and have a protrusion shape. Each of the locking units 4c is a locking claw capable of locking to a locking recess of the locking unit 37d in the exterior installation unit 37. The corrugated cover 4 is locked to the locking unit 37d of the exterior installation unit 37 via the pair of locking units 4c, and the end of the corrugated tube T is interposed and held between the frame 31 and the corrugated cover 4.

The corrugated cover 4 of the present embodiment is further firmly fitted to the casing 3, by not only being locked by the pair of locking units 4c, but also because an end to be pressed 4d is pressed against the frame 31 by the lower cover 32.

In this example, the end to be pressed 4d is an end of one side of the corrugated cover 4 in the stacking direction as well as an end opposite from the side toward which the corrugated tube T is extended. In other words, while the corrugated cover 4 is fitted to the exterior installation unit 37, the end to be pressed 4d is an end disposed at a vertically lower side as well as an end that extends in the horizontal direction orthogonal to the vertical direction. While the corrugated cover 4 is fitted to the exterior installation unit 37, a tip end side of the end to be pressed 4d disposed at a vertically lower side is bent to the side of the frame 31 (see particularly FIG. 7 and the like).

While the corrugated cover 4 is fitted to the exterior installation unit 37, in the corrugated cover 4, an end surface abutting unit 4e is formed on a portion on the vertically upper side of the end to be pressed 4d. The end surface abutting unit 4e is a protrusion formed on the surface outside the cover wall surface 4a, along the direction intersecting the stacking direction (in this example, in the horizontal direction). While the end to be pressed 4d is pressed toward the frame 31 by the lower cover 32, the end surface abutting unit 4e is formed as a surface with which an end surface on the vertically upper side of the lower cover 32 (more specifically, the tip end surface on the vertically upper side of a pressing wall 32c, which will be described below) comes into contact, and that receives the end surface on the vertically upper side of the lower cover 32.

The lower cover 32 of the present embodiment includes the pressing wall 32c that presses the end to be pressed 4d against the frame 31. While the lower cover 32 is fitted to the frame 31, the pressing wall 32c is provided at the vicinity of the insertion port 36 and the exterior installation unit 37 of the frame 31. Also, the end to be pressed 4d is interposed between the pressing wall 32c and the frame 31. The pressing wall 32c comes into contact with the end to be pressed 4d and presses the end to be pressed 4d toward the frame 31. The pressing wall 32c is an end opposite from the side of the base unit 32b of the side wall 32a in the lower cover 32, in other words, the end at the side of the frame 31. More specifically, the pressing wall 32c is a tip end on the vertically upper side of a step unit 32d formed on the side wall 32a. The step unit 32d formed on the side wall 32a is a relief unit so that the end to be pressed 4d of the corrugated cover 4 can enter the inside of the pressing wall 32c, in other words, a portion to offset the pressing wall 32c toward outside.

While the electric wires W are inserted into the insertion port 36, and the end of the corrugated tube T is arranged on the installation wall surface 37a of the exterior installation unit 37 in the frame 31 in the stacking direction, in the electrical connection box 1 configured as above, the corrugated cover 4 is fitted to the exterior installation unit 37. This is done when the locking units 4c of the corrugated cover 4 are locked to the locking unit 37d of the exterior installation unit 37. The electric wires W are bent outside the insertion port 36 and extend vertically upward with the corrugated tube T along the side wall 31a. In this state, in the electrical connection box 1, the receiving unit 37b comes into contact with and receives the end surface of the corrugated tube T. Also, the end of the corrugated tube T is interposed and held between the corrugated cover 4 and the exterior installation unit 37 of the frame 31. In this state, in the electrical connection box 1, the fitting protrusion 37c of the exterior installation unit 37 and the fitting protrusion 4b of the corrugated cover 4 are fitted and meshed to the uneven portions in a bellows shape, formed on the outer peripheral surface of the corrugated tube T. Thus, it is possible to prevent the end of the corrugated tube T from being disengaged from between the corrugated cover 4 and the exterior installation unit 37.

While the corrugated cover 4 is fitted to the exterior installation unit 37 so as to interpose the end of the corrugated tube T therebetween, in the electrical connection box 1, the lower cover 32 is fitted so as to close the opening on the vertically lower side of the frame 31. In this state, in the electrical connection box 1, a tip end surface on the vertically upper side of the pressing wall 32c of the lower cover 32 comes into contact with the end surface abutting unit 4e of the corrugated cover 4. Also, the end to be pressed 4d of the corrugated cover 4 is positioned inside the pressing wall 32c. Thus, the end to be pressed 4d is pressed toward the frame 31 by the pressing wall 32c. In this state, in the electrical connection box 1, the end to be pressed 4d and the pressing wall 32c have an overlapped portion 39. The overlapped portion 39 is overlapped in the direction toward which the end to be pressed 4d is pressed by the pressing wall 32c, in this example, in the inward and outward direction of the casing 3. The overlapped portion 39 is an overlapping portion in which the end to be pressed 4d is positioned inside, and the pressing wall 32c is positioned outside.

The electrical connection box 1 described above includes the casing 3 and the corrugated cover 4.

The casing 3 is provided with the frame 31 that houses the electronic components 2 therein, and the lower cover 32. The frame 31 and the lower cover 32 are stacked in the stacking direction and are fitted to each other. The casing 3 also includes the insertion port 36 formed on the frame 31 and through which the electric wires W connected to the electronic components 2 are inserted. The casing 3 further includes the exterior installation unit 37 formed outside the insertion port 36 of the frame 31 and on which the end of the corrugated tube T externally fitted to the electric wires W are arranged in the stacking direction.

The corrugated cover 4 includes the pair of locking units 4c that face each other in the direction intersecting the stacking direction. The corrugated cover 4 is locked to the exterior installation unit 37 via the pair of locking units 4c, and interposes and holds the end of the corrugated tube T between the corrugated cover 4 and the frame 31.

The wire harness WH described above includes the electric wires W, the corrugated tube T externally fitted to the electric wires W, and the electrical connection box 1 described above that houses the electronic components 2 connected to the electric wires W. The lower cover 32 includes the pressing wall 32c that interposes the end to be pressed 4d, which is an end at one side of the corrugated cover 4 in the stacking direction as well as an end opposite from the side toward which the corrugated tube T is extended, between the frame 31 and the pressing wall 32c. The pressing wall 32c presses the end to be pressed 4d toward the frame 31.

Thus, in the electrical connection box 1 and the wire harness WH, the electric wires W are inserted into and extracted from the casing 3 through the insertion port 36 formed on the frame 31 that configures the casing 3. Also, the end of the corrugated tube T externally fitted to the electric wires W is installed on the exterior installation unit 37. In the electrical connection box 1 and the wire harness WH, the end of the corrugated tube T is interposed and held between the frame 31 on which the exterior installation unit 37 is formed, and the corrugated cover 4 fitted to the exterior installation unit 37. In this configuration, in the electrical connection box 1 and the wire harness WH, the pair of locking units 4c lock the corrugated cover 4 with the exterior installation unit 37. Also, the end to be pressed 4d of the corrugated cover 4 is interposed between the frame 31 and the lower cover 32, and the end to be pressed 4d is pressed toward the frame 31 by the pressing wall 32c of the lower cover 32. Consequently, it is possible to firmly fit the corrugated cover 4 used for holding the end of the corrugated tube T, to the casing 3. Further, in the electrical connection box 1 and the wire harness WH, the tip end side of the end to be pressed 4d at a vertically lower side is bent toward the frame 31. Also, the step unit 32d is formed at the side of the pressing wall 32c as a relief unit so that the end to be pressed 4d can enter the inside of the pressing wall 32c. Thus, when the lower cover 32 is being fitted, the end to be pressed 4d can be easily pressed toward the frame 31, by the pressing wall 32c of the lower cover 32. As a result, in the electrical connection box 1 and the wire harness WH, it is possible to firmly fix the corrugated cover 4 by three points. Consequently, for example, it is possible to prevent the corrugated cover 4 from coming loose, and it is also possible to firmly fit the end of the corrugated tube T, which is externally fitted to the electric wires W.

In the electrical connection box 1 and the wire harness WH described above, the end to be pressed 4d and the pressing wall 32c have the overlapped portion 39 that is overlapped in the direction toward which the end to be pressed 4d is pressed by the pressing wall 32c. Hence, in the electrical connection box 1 and the wire harness WH, the overlapped portion 39 has a labyrinth-like structure in which the end to be pressed 4d and the pressing wall 32c are alternately overlapped with each other in the inward and outward direction of the casing 3. Consequently, it is possible to prevent water from entering the side of the housing space 35 from outside through a gap between the corrugated cover 4 and the lower cover 32. Also, for example, even if the water has entered, it is possible to discharge the water in a predetermined direction through a gap between the end to be pressed 4d and the pressing wall 32c.

The electrical connection box and the wire harness according to the embodiment in the present invention described above is not limited to the embodiment described above, and various modifications may be made without departing from the spirit and scope of the appended claims.

The casing 3 described above has the three-layer divided structure in which the frame 31, the lower cover 32, and the upper cover 33 are divided. However, it is not limited thereto, and the casing 3 may include at least the first member (frame 31) and the second member (lower cover 32), and for example, the frame 31 and the upper cover 33 may be integrally formed.

In the electrical connection box and the wire harness according to the present invention, electric wires are inserted into and extracted from a casing through an insertion port formed on a first member that configures the casing, and an end of an exterior member externally fitted to the electric wires is installed on an exterior installation unit. Also, in the electrical connection box and the wire harness, the end of the exterior member is interposed and held between the first member on which the exterior installation unit is formed and a cover member fitted to the exterior installation unit. In this configuration, in the electrical connection box and the wire harness, not only a pair of locking units lock the cover member with the exterior installation unit, but also an end to be pressed of the cover member is interposed between the first member and a second member, and the end to be pressed is pressed toward the first member side by a pressing wall of the second member. Thus, the cover member that holds the end of the exterior member is firmly fitted to the casing. As a result, the electrical connection box and the wire harness can advantageously and firmly fit the end of the exterior member that is externally fitted to the electric wires.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box comprising:
    a casing that includes
        a first member that houses inside an electronic component, and a second member, the first member and the second member being stacked in a stacking direction and fitted to each other,
        an insertion port formed on the first member and through which an electric wire connected to the electronic component is inserted, and
        an exterior installation unit formed outside the insertion port of the first member, and on which an end of an exterior member externally fitted to the electric wire is arranged in the stacking direction; and
    a cover member that includes a pair of locking units that face each other in a direction intersecting the stacking direction, the cover member being locked to the exterior installation unit via the pair of locking units, and interposing and holding the end of the exterior member between the cover member and the first member, wherein the second member includes a pressing wall that interposes an end to be pressed of the cover member between the pressing wall and the first member and presses the end to be pressed toward the first member side, and the cover member includes an end surface abutting protrusion that extends outwardly from an outer surface of the cover member in a direction that intersects the stacking direction, and the end surface abutting rib protrusion contacts a tip end surface of the pressing wall such that the end surface abutting rib lies outside of the second member.

2. The electrical connection box according to claim 1, wherein
the end to be pressed and the pressing wall have an overlapped portion that is overlapped in a direction toward which the end to be pressed is pressed by the pressing wall.

3. The electrical connection box according to claim 1, wherein the end to be pressed being an end of one side of the cover member in the stacking direction as well as an end opposite from a side toward which the exterior member is extended.

4. The electrical connection box according to claim 1, wherein the end to be pressed includes a tip end side that is bent to the side of the first member such that the tip end side is spaced away from the pressing wall.

5. The electrical connection box according to claim 1, wherein the exterior installation unit includes a pair of locking units, and the cover member moves in a direction that intersects the stacking direction as the locking units of the cover member are brought into engagement with the locking units of the exterior installation unit.

6. The electrical connection box according to claim 1, wherein the second member is a lower cover that closes an opening on the stacking direction lower side of the first member.

7. A wire harness comprising:
an electric wire;
an exterior member externally fitted to the electric wire; and
an electrical connection box that includes
a casing including
a first member that houses inside an electronic component connected to the electric wire, and a second member, the first member and the second member being stacked in a stacking direction and fitted to each other,
an insertion port formed on the first member and through which the electric wire is inserted, and
an exterior installation unit formed outside the insertion port of the first member, and on which an end of the exterior member externally fitted to the electric wire is arranged in the stacking direction, and
a cover member that has a pair of locking units that face each other in a direction intersecting the stacking direction, the cover member being locked to the exterior installation unit via the pair of locking units, and interposing and holding the end of the exterior member between the cover member and the first member, wherein
the second member includes a pressing wall that interposes an end to be pressed of the cover member between the pressing wall and the first member and presses the end to be pressed toward the first member side, and
the cover member includes an end surface abutting protrusion that extends outwardly from an outer surface of the cover member in a direction that intersects the stacking direction, and the end surface abutting rib protrusion contacts a tip end surface of the pressing wall such that the end surface abutting rib lies outside of the second member.

8. The wire harness according to claim 7, wherein the end to be pressed being an end of one side of the cover member in the stacking direction as well as an end opposite from a side toward which the exterior member is extended.

9. The wire harness according to claim 7, wherein the end to be pressed includes a tip end side that is bent to the side of the first member such that the tip end side is spaced away from the pressing wall.

10. The wire harness according to claim 7, wherein the exterior installation unit includes a pair of locking units, and the cover member moves in a direction that intersects the stacking direction as the locking units of the cover member are brought into engagement with the locking units of the exterior installation unit.

11. The wire harness according to claim 7, wherein the second member is a lower cover that closes an opening on the stacking direction lower side of the first member.

* * * * *